United States Patent [19]
Khoury

[11] Patent Number: 5,838,194
[45] Date of Patent: Nov. 17, 1998

[54] CONSTANT SETTLING TIME AUTOMATIC GAIN CONTROL CIRCUITS

[75] Inventor: John M. Khoury, New Providence, N.J.

[73] Assignee: Lucent Technologies Inc., Murray Hill, N.J.

[21] Appl. No.: 732,958

[22] Filed: Oct. 17, 1996

[51] Int. Cl.$^6$ ....................................................... H03G 3/30
[52] U.S. Cl. ........................................... 330/139; 330/279
[58] Field of Search ................................... 330/129, 133, 330/138, 139, 278, 279, 280

[56] References Cited

U.S. PATENT DOCUMENTS

| | | | |
|---|---|---|---|
| 4,263,560 | 4/1981 | Ricker | 330/279 X |
| 4,546,326 | 10/1985 | Van Uffelen et al. | 330/279 X |
| 5,146,180 | 9/1992 | Hyakutake | 330/279 X |
| 5,278,518 | 1/1994 | Debroux | 330/279 |
| 5,451,901 | 9/1995 | Welland | 330/279 X |

OTHER PUBLICATIONS

"A Wide Range and High Speed Automatic Gain Control", by Eugenio J. Tacconi and Carols F. Christiansen, Proceedings og Int'l Conference on Particle Accelerators, May 17–20, 1993, Washington, DC, 1993 IEEE, pp. 2139–2141.

"A Low–Voltage Low–Power Fully–Integratable Automatic Gain Control for Hearing Instruments", by Wouter A. Serdijn et al., IEEE Journal of Solid–State Circuits, vol. 29, No. 8, Aug. 1994, pp. 944–946.

"Statistical Description of Non–Coherent Automatic Gain Control", by L. Popken and W. Kriedte, International Journal of Satellite Communications, vol. 11, 81–86 (1993) pp. 81–86.

"A Low–Noise Amplifier with Automatic Gain Control and Anticlipping Control iin CMOS Technology", Jörg Hauptmann et al., IEEE Journal of Solid–State Circuits, vol. 27, No. 7, Jul. 1992, pp. 974–981.

"Log–domain filtering, an approach to current–mode filtering", by D.R. Frey, IEE Proceedings–G, vol. 140, No. 6, Dec. 1993, pp. 406–416.

"A Method for Design of Automatic Gain Control Circuits", by Douglas N. Green and Yaozhong Shi, 1986 IEEE, pp. 1133–1136.

*Primary Examiner*—James B. Mullins

[57] ABSTRACT

Constant setting time is achieved in automatic gain control (AGC) circuits having a variable gain amplifier (VGA) and a feedback loop with a loop filter, where the VGA has a non-exponential gain characteristic and the loop filter is allowed to be non-linear. This design differs from traditional AGC circuits in which the VGA had an exponential gain characteristic and the loop filter was linear. Relaxation of these requirements as provided by the invention permits AGC circuits to be implemented in MOS and other technologies in which AGC circuits of traditional designs are difficult to implement.

12 Claims, 12 Drawing Sheets

CONSTANT SETTLING TIME AUTOMATIC GAIN CONTROL CIRCUITS

BACKGROUND OF THE INVENTION

1. Field of the Invention

The present invention relates to automatic gain control (AGC) circuits, and, in particular, to AGC circuits having constant settling time.

2. Description of the Related Art

Automatic gain control circuits are used in many systems where the input signal's peak amplitude can vary over a wide dynamic range. The role of the AGC circuit is to provide a relatively constant output amplitude so that circuits following the AGC circuit can have a more limited dynamic range. If the peak amplitude at the input of the AGC circuit changes slowly relative to the frequency of the input signal, the AGC circuit can track the signal and adjust the gain so that the output amplitude remains within the desired bound. In most system applications, the time to adjust the gain in response to an input amplitude change should remain relatively constant, independent of the input amplitude level and hence gain setting of the amplifier. Achieving such a constant gain settling time permits the AGC loop's bandwidth to be maximized for fast signal acquisition while maintaining stability over all operating conditions.

Figure 1:
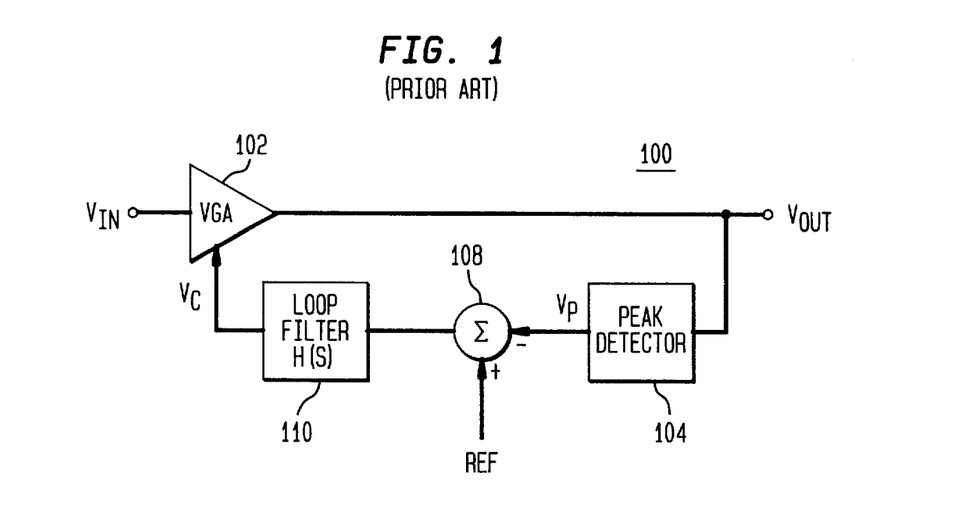
FIG. 1 shows a block diagram of a conventional prior-art AGC circuit comprising a variable gain amplifier, a peak detector, a summation node, and a loop filter.

FIG. 1 shows a block diagram of conventional AGC circuit 100 comprising variable gain amplifier (VGA) 102, peak detector 104, summation node 108, and loop filter 110. The gain of VGA 102, $G(V_C)$, is controlled with the control signal $V_C$. Those skilled in the art will understand that generality is not lost by expressing signals as voltages. Peak detector 104, summation node 108, and loop filter 110 form a feedback circuit that monitors the peak amplitude $A_{OUT}$ of the output signal $V_{OUT}$ and adjusts the VGA gain until the measured peak amplitude $V_P$ is made equal to the DC reference voltage $V_{REF}$. The output of AGC circuit 100, $V_{OUT}(t)$, is the VGA gain $G(V_C)$ times the input signal $V_{IN}(t)$, such that: $V_{OUT}(t)=G(V_C) V_{IN}(t)$.

Since the feedback loop only responds to peak amplitudes, the peak $A_{OUT}$ of the output voltage $V_{OUT}$ is given by Equation (1) as follows:

$$A_{OUT}=G(V_C)A_{IN} \quad (1)$$

wherein $A_{IN}$ is the peak amplitude of the input signal $V_{IN}$.

In prior art solutions, in order for AGC circuit 100 to have a constant settling time, VGA 102 was required to have an exponential gain characteristic with respect to the control signal $V_C$ and loop filter 110 was required to be linear and time-invariant. Such a constant settling time AGC circuit is relatively easy to implement as an integrated circuit (IC) using bipolar technology, because the exponential function is readily available with the base-emitter voltage to collector current characteristic. However, achieving an exponential relationship in metal oxide semiconductor (MOS) devices and other technologies is less obvious. See, for example, R. Harjani, "A Low-Power CMOS VGA for 50 Mb/s Disk Drive Read Channels," *IEEE Transactions on Circuits and Systems*—II, Vol. 42, No. 6, pp. 370–376, June 1995 (referred to herein as "the Harjani reference") and R. Gomez et al., "A 50-MHz CMOS Variable Gain Amplifier for Magnetic Data Storage Systems, *IEEE Journal of Solid-State Circuits*, Vol. 27, No. 6, pp. 935–939, June 1992 ("the Gomez reference"), which are both incorporated herein by reference.

A number of solutions have been proposed to achieve a VGA with an exponential gain characteristic using MOS technology. One solution is to create a gain function that uses a piecewise linear approximation to the exponential function. For further description, see U.S. Pat. No. 5,412,346 (Burger et al.), entitled "Variable Gain Voltage Signal Amplifier," issued May 2, 1995, which is incorporated herein by reference. Such a method can work reasonably well; however, the derivative of the gain with respect to the control signal will have discontinuities that may cause complications in the circuit operation.

Figure 2:
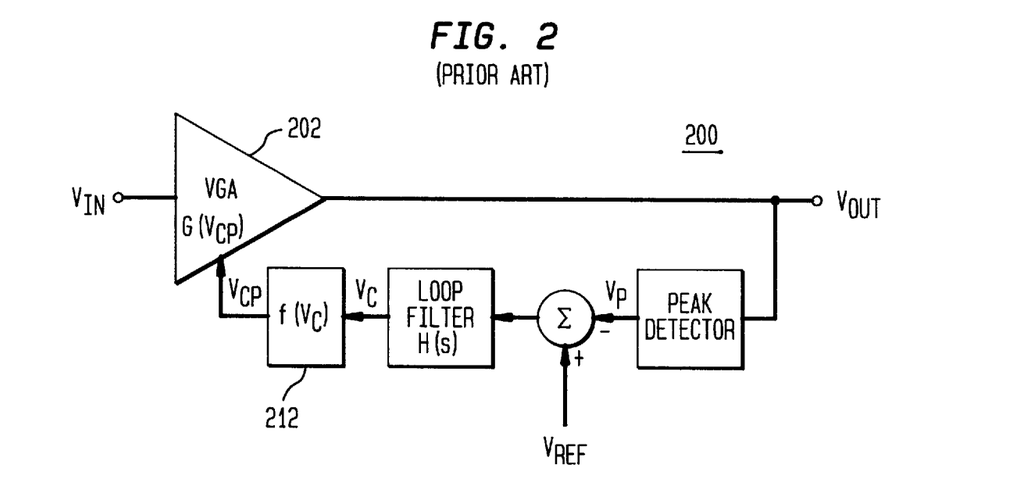
FIG. 2 shows a block diagram of a prior-art solution for achieving a VGA with an exponential gain characteristic.

FIG. 2 shows a block diagram of AGC circuit 200, which is another solution for achieving a VGA with an exponential gain characteristic. In this solution, the control voltage $V_C$ is predistorted by adding processing block 212 in the feedback circuit, so that the overall gain response is exponential. The nonlinear function $f(V_C)$ of processing block 212 is chosen such that equation (2) is satisfied as follows:

$$G(f(V_C))=k_{G2}e^{k_{G1}V_C} \quad (2)$$

where $k_{G1}$ and $k_{G2}$ are constants. The function $f(V_C)$ is designed with accurate modeling of the gain function G of VGA 202 and the target exponential function.

With both of these solutions, approximation of the exponential function is required. Nevertheless, maintaining a good fit over all processing and temperature changes may be difficult.

Yet another solution is to approximate the exponential gain function by a function of the form given in Equation (3) as follows:

$$e^w \approx \frac{(1+w/2)}{(1-w/2)} \quad (3)$$

Circuit implementations for such a function have been used in several AGC circuits. For further description, see J. Hauptmann, et al., "A Low-Noise Amplifier with Automatic Gain Control and Anticlipping Control in CMOS Technology," *IEEE Journal of Solid-State Circuits*, Vol. 27, No. 7, pp. 974–981, July 1992; the Harjani reference; and D. Welland et al., "A Digital Read/Write Channel with EEPR4 Detection," *IEEE International Solid-State Circuits Conference*, 1994, San Francisco, pp. 276–277, 352 ("the Welland reference"), which are all incorporated herein by reference. These solutions provide only a approximation of the ideal exponential equation.

The present invention is directed to a novel approach to achieving automatic gain control circuits having relatively constant settling times.

Further aspects and advantages of this invention will become apparent from the detailed description which follows.

SUMMARY OF THE INVENTION

The present invention is directed to an automatic gain control circuit, comprising a variable gain amplifier having a non-exponential gain characteristic and a feedback loop providing a control signal to control gain of the VGA, the feedback loop having a non-linear loop filter.

BRIEF DESCRIPTION OF THE DRAWINGS

Other aspects, features, and advantages of the present invention will become more fully apparent from the following detailed description, the appended claims, and the accompanying, drawings in which:

DETAILED DESCRIPTION

The present invention is directed to automatic gain control circuits having constant settling time in which the constraint that the variable gain amplifier of the AGC circuit has an exponential gain characteristic is removed. In order to achieve constant settling time, the relaxation of the constraint that the VGA has an exponential gain characteristic is accompanied by the relaxation of the requirement that the loop filter be linear and time-invariant. The following section contains a derivation of equations that represent the time constant for AGC circuits of the present invention.

Derivation of Time Constant Equations

Figure 3:
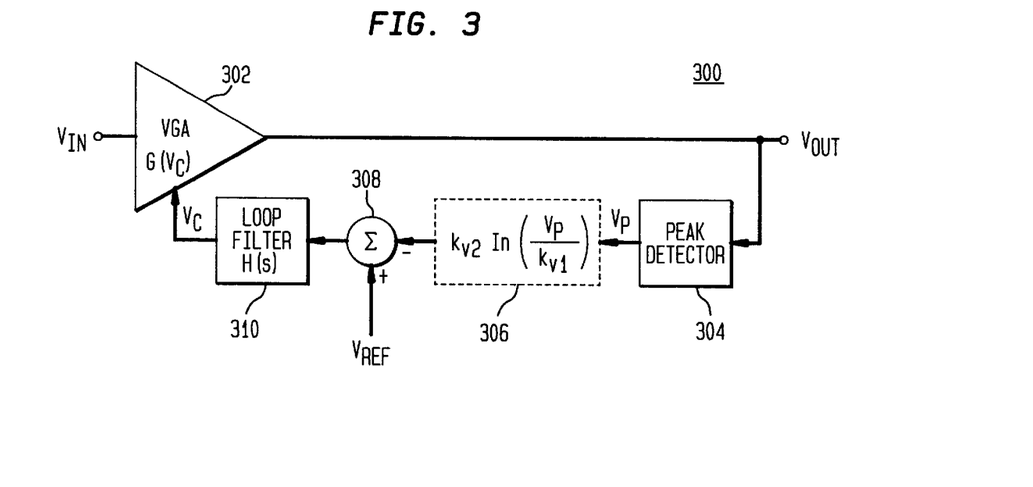
FIG. 3 shows a block diagram of a generalized AGC circuit comprising a V(GA, a peak detector, a logarithmic amplifier, a summation node, and a loop filter.

FIG. 3 shows a block diagram of a generalized AGC circuit 300 comprising VGA 302, peak detector 304, logarithmic (log) amplifier 306, summation node 308, and linear loop filter 310. In general, AGC circuit 300 is a nonlinear system having a gain acquisition settling time that is input signal level dependent. With the addition of log amplifier 306 and appropriate design of the other loop components, AGC circuit 300 can operate linearly in decibels. This means that, if the amplitude of the input and output signals of AGC circuit 300 are expressed in decibels (dB), then tile system response can be made linear with respect to these quantities.

Figure 4:
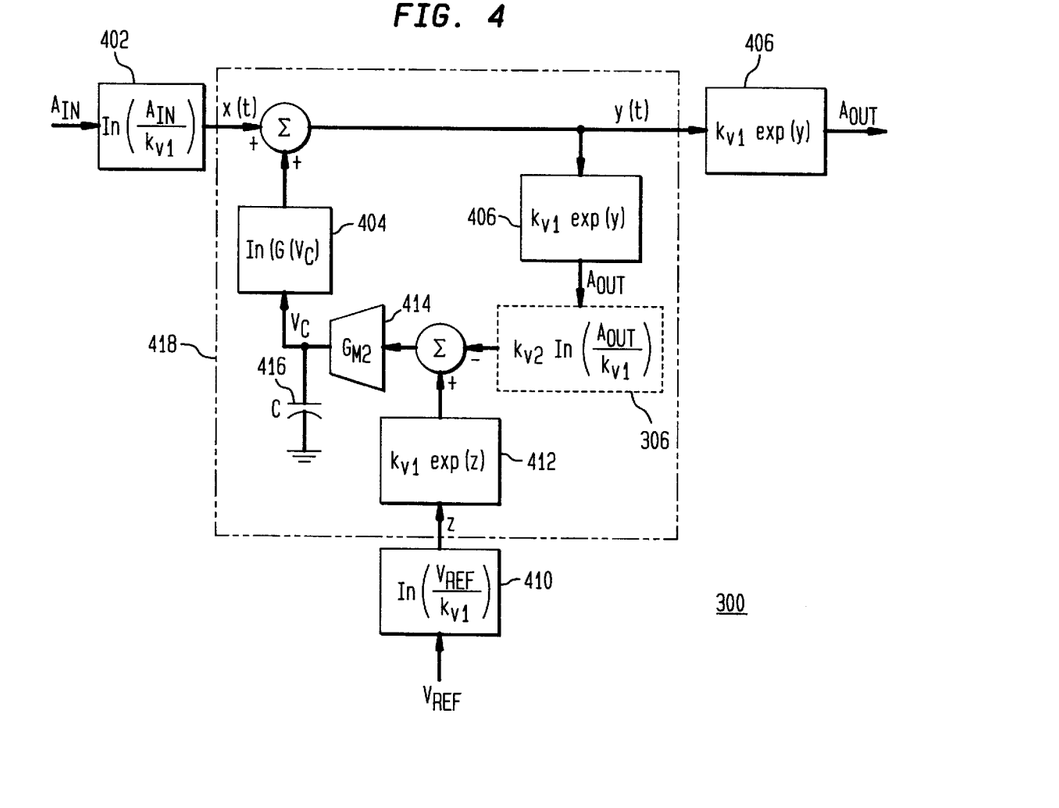
FIG. 4 shows a block diagram of an equivalent representation of the AGC circuit of FIG. 3.

FIG. 4 shows a block diagram of an equivalent representation of AGC circuit 300 of FIG. 3. Since AGC circuit 300 only responds to amplitude changes, the input and output signals are represented as the amplitudes $A_{IN}(t)$ and $A_{OUT}(t)$ respectively. Since VGA 302 of FIG. 3 multiplies $A_{IN}(t)$ and $G(V_C)$, VGA 302 is represented in FIG. 4 as the sum of two logarithms 402 and 404 followed by an exponentiation 406. Peak detector 304 of FIG. 3 is assumed to extract the peak amplitude of $V_{OUT}(t)$ linearly and much faster than the basic operation of the loop, so that $V_P$ of FIG. 3 is $A_{OUT}$ of FIG. 4. As such, peak detector 304 is not explicitly shown in FIG. 4. Loop filter 310 of FIG. 4 with linear transfer function H(s) is replaced in FIG. 4 with an integrator, consisting of amplifier 414 and capacitor 416, which realizes H(s) as shown in Equation (4) as follows:

$$H(s) = \frac{G_{M2}}{sC} \quad (4)$$

where $G_{M2}$ is the gain of amplifier 414 and C is the capacitance of capacitor 416. The constants $k_{v1}$ and $k_{v2}$ in FIG. 4 have units of volts and are used to maintain consistent dimensional analysis.

Modeling of AGC circuit 300 as shown in FIG. 4 eliminates several steps in the mathematical derivations that follow and gives added intuition. If system 418 within the dotted lines in FIG. 4 can be made linear with respect to input x(t) and output y(t), then the overall response of AGC circuit 300 will be linear in dB. Within a constant of proportionality, the units of x(f) and y(t) are in dB.

Referring again to FIG. 3, conditions can be derived such that the settling time constant of AGC circuit 300 with log amplifier 306 will be independent of input amplitude. Such a constraint is equivalent to forcing system 418 of FIG. 4 with log amplifier 306 to be a linear system with input x(t) and output y(t). The output y(t) is given by Equation (5) as follows:

$$y(t) = x(t) + \ln G(V_C) \quad (5)$$

The gain control voltage $V_C(t)$ is derived by Equation (6) as follows:

$$V_c(t) = \int_0^t \frac{G_{M2}}{C} [k_{v1}e^z - k_{v2}\ln(e^{y(\tau)})]d\tau \quad (6)$$

Taking the derivative of Equation (5) and substituting in the derivative of Equation (6), Equation (7) is obtained as follows:

$$\frac{dy}{dt} = \frac{dx}{dt} + \frac{1}{G(V_c)} \frac{dG}{dV_c} \frac{G_{M2}}{C} [k_{v1}e^z - k_{v2}\ln(e^{y(t)})] \quad (7)$$

Equation (7) describes a nonlinear system response of y(f) to an input x(f) unless constraints are placed on the functions. Although many constraints are possible, the following are those with practical circuit implementations. The first step towards obtaining a linear relationship between x(t) and y(t) is to force the coefficient in the second term of Equation (7) to equal a constant $k_x$ as given by Equation (8) as follows:

$$\frac{1}{G(V_c)} \frac{dG}{dV_c} \frac{G_{M2}}{C} = k_x \quad (8)$$

Substituting Equation (8) into Equation (7) yields Equation (9) as follows:

$$\frac{dy}{dt} + k_x k_{v2} y(t) = \frac{dx}{dt} + k_x V_{REF} \quad (9)$$

where, from FIG. 4, the equality of $k_{v1}e^z$ to $V_{REF}$ is used. Equation (9) describes a first-order linear system having a high-pass response from the input x(t) to the output y(t). The time constant $\tau$ of the system is given by Equation (10) as follows:

$$\tau = \frac{1}{k_x k_{v2}} = \left[ \frac{1}{G(V_c)} \frac{dG}{dV_c} \frac{G_{M2}}{C} k_{v2} \right]^{-1} \quad (10)$$

The classical criterion for constant settling time of AGC circuit 300 assumes that $G_{M2}$ and C are constants in Equations (8) and (10), forcing the gain control function of VGA 302 to satisfy the constraint of Equation (11) as follows:

$$\frac{1}{G(V_c)} \frac{dG(V_c)}{dV_c} = k_{G1} \quad (11)$$

where $k_{G1}$ is a constant. Rearranging Equation (11) and integrating both sides of the resulting equation produces the well-known exponential gain characteristic of VGA 302 as given by Equation (12) as follows:

$$G(V_C) = k_{G2} e^{k_{G1} V_C} \quad (12)$$

where $k_{G2}$ is a constant of integration. One can easily determine that the gain in decibels dB should vary linearly with the control signal $V_C$. For further discussion, see E. J. Tacconi et al., "A Wide Range and High Speed Automatic Gain Control," *Proceedings of the International Conference on Particle Accelerators*, Washington, D.C., pp. 2139–2141, May 1993; W. A. Serdijn et al., "A Low-Voltage Low-Power Fully-Integratable Automatic Gain Control for Hearing Instruments," *IEEE Journal of Solid-State Circuits*, Vol. 29, No. 8, pp. 943–946, Aug. 1994; L. Popken et al., "Statistical Description of Non-coherent Automatic Gain Control," *International Journal of Satellite Communications*, Vol. 11, pp. 81–86, April 1993; and J. Smith, *Modern Communication Circuits*, McGraw-Hill, 1986. Chapter 5, all four of which are incorporated herein by reference.

Using Equation (12) for an exponential VGA gain characteristic and Equation (10), the time constant of AGC circuit 300 with logarithmic amplifier 306 included is given by Equation (13) as follows:

$$\tau_{exp-log} = \frac{C}{G_{M2} k_{G1} k_{v2}} \quad (13)$$

With the constraints provided, AGC loop 300 will operate as a linear system in decibels for any change in input amplitude. For example, if the input has a step increase in amplitude of 3 dB, the output will have a step increase of 3 dB and decay exponentially to within 1.1 dB of the final value after a single time constant.

In many AGC circuits, logarithmic amplifier 306 of FIGS. 3 and 4 is omitted. The objective of constant settling time can still be met under certain small-signal approximations. The key assumption in the following derivation will be that the output magnitude of AGC circuit 300 is operating near its fully converged state (i.e., $A_{OUT} \approx V_{REF}$).

Using Equations (7) and (8) and ignoring log amplifier 306 in FIG. 4, Equation (14) is obtained as follows:

$$\frac{dy}{dt} = -\frac{dx}{dt} + k_x[V_{REF} - k_{v1} e^{y(t)}] \quad (14)$$

The system response is non-linear even with a constant $k_x$ due to $e^{y(t)}$. If the changes in the input and output amplitude levels are small, then the exponential $e^{y(t)}$ in Equation (14) can be expanded in a Taylor series. Assume that AGC circuit 300 is initially converged, such that the output amplitude $A_{OUT}$ equals $V_{REF}$. Referring to FIG. 4, this implies that y(t)=z and the Taylor expansion is shown in Equation (15) as follows:

$$e^{y(t)} \approx e^z [1+y(t)-z+\ldots] \quad (15)$$

Since $k_{v1} e^z = V_{REF}$, Equation (14), the differential equation governing the operation of AGC circuit 300, can be rewritten as Equation (16) as follows:

$$\frac{dy}{dt} + k_x V_{REF} y(t) = -\frac{dx}{dt} + k_x V_{REF} \ln\left(\frac{V_{REF}}{k_{v1}}\right) \quad (16)$$

The first-order linear system described by Equation (16) has a high-pass response with a time constant given by Equation (17) as follows:

$$\tau = \frac{1}{k_x V_{REF}} = \left[ \frac{1}{G(V_C)} \frac{dG}{dV_c} \frac{G_{M2}}{C} V_{REF} \right]^{-1} \quad (17)$$

If the loop filter components $G_{M2}$ and C are linear and time invariant, then tic constraint on constant settling time for AGC circuit 300 is that VGA 302 has an exponential gain control characteristic as in Equation (12). Under these conditions, AGC circuit 300 without log amplifier 306 has a time constant given by Equation (18) as follows:

$$\tau_{exp} = \frac{C}{G_{M2} k_{G1} V_{REF}} \quad (18)$$

In this case, the settling time is a function of the input variable $V_{REF}$ indicating that the system is fundamentally nonlinear. By changing $V_{REF}$, the operating point where the small-signal approximation was made changes and hence the AGC loop parameters change, as should be expected. In contrast, in Equation (13), the time constant is independent of any "bias" quantities since AGC circuit 300 is perfectly modeled as a linear system, for input/output quantities in dB.

As shown in Equation (9), if $k_x$ remains signal independent, then the AGC circuit will behave as a first-order linear system in dB. In AGC circuit 300 of FIGS. 3 and 4, $k_x$ can be held constant by designing VGA 302 to have an exponential gain characteristic while the ratio $G_{M2}/C$ is held constant.

Rather than assuming a linear time-invariant loop filter as in FIGS. 1 and 2, an additional degree of freedom is obtained if the loop filter allowed to be nonlinear. For further description of nonlinear filters, see R. W. Adams, "Filtering in the log domain," Preprint 1470, presented at the 63rd Audio Engineering Society Conference, New York, May 1979; E. Seevinck, "Companding current-mode integrator: A new circuit principal for continuous-time monolithic filters," *Electronic Letters*, Vol. 26, pp. 2046–2047, November 1990; D. R. Frey, "Log-domain filtering: an approach to current-mode filtering," *IEEE Proceedings-G*, Vol. 140, No. 6, pp. 406–416, December 1993; and Y. Tsividis, "On Linear Integators and Differentiators Using Instantaneous Companding," *IEEE Transactions on Circuits and systems*—II, Vol. 42, No. 8, pp. 561–564, August 1995, which are all incorporated herein by reference. With this additional degree of freedom, the VGA no longer requires an exponential characteristic.

The nonlinear loop filter can in general have either $G_{M2}$ or C signal dependent. In one implementation, the capacitance may be assumed to be fixed and linear, while $G_{M2}$ is a function of $V_C$. Using Equation (8), the requirement for constant AGC settling time can be re-written as Equation (19) as follows:

$$\frac{G_{M2}(V_C)}{G(V_C)} \frac{dG(V_C)}{dV_c} = k_x C = \text{constant} \quad (19)$$

Those skilled in the art will recognize that many possible functions $G_{M2}(V_C)$ and $G(V_C)$ exist that will satisfy Equation (19).

Linear Variation of VGA Gain with Control Signal $V_c$

Figure 5:
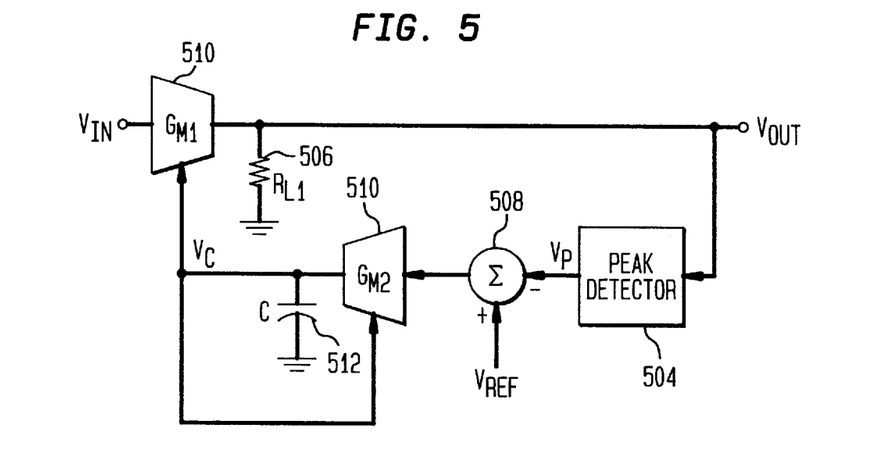
FIG. 5 shows a block diagram of an AGC circuit, according to one embodiment of the present invention.

FIG. 5 shows a block diagram of AGC circuit 500, according to one embodiment of the present invention. AGC circuit 500 comprises transconductance amplifier 502, peak detector 504, resistor 506, summing junction 508, transconductance amplifier 510, and capacitor 512. The VGA gain $G(V_C)$ is realized with transconductance amplifier 502 loaded by resistor 506. In AGC circuit 500, the gain of transconductance amplifier 502 varies linearly with the control voltage $V_C$. As such, the derivative of the VGA gain with respect to the control voltage $(dG(V_C)/dV_C)$ is a constant. In this case, Equation (19) will be satisfied if the ratio of $G_{M2}V_C$ to $G(V_C)$ is made constant. The following Equations (20)–(22) impose constraints on the VGA gain characteristic and loop filter non-linearity (i.e., transconductor) in order to satisfy Equation (19):

$$G(V_C) = G_{M1}(V_C) R_{L1} \tag{20}$$

$$G_{M1}(V_C) = k_1 G_M(V_C) = k_1 G_0 V_C \tag{21}$$

$$G_{M2}(V_C) = k_2 G_M(V_C) = k_2 G_0 V_C \tag{22}$$

where $G_0$, $k_1$, and $k_2$ are constants.

The open-loop VGA stricture of FIG. 5 is typically used in wide-band applications such as in disk drive read channels. For further description, see the Harjani reference, the Gomez reference, and the Welland reference, which are all incorporated herein by reference.

Since the VGA and loop filter of AGC circuit 500 use the same gain setting function $G_M(V_C)$, within a constant of proportionality, good tracking over processing and temperature in an integrated circuit implementation can be achieved and maintaining a constant ratio of $G_{M2}(V_C)$ to $G(V_C)$ in Equation (19) will be obtained. Those skilled in the art will understand that linear variation of the VGA gain with the control signal $V_c$ is readily achieved in virtually all IC technologies since linear elements such as resistors are standard components. Linear elements such as resistors can be used to generate negative feedback signals to force the variation of the transconductance amplifier to be linear with the control signal.

Nonlinear Variation of VGA Gain with Control Signal $V_C$

Equation (19) can be satisfied without requiring that the VGA have a linear relationship to $V_C$.

This means that an AGC circuit can still be linear in dB even if the VGA has a non-linear relationship to $V_C$. As described below, Equation (19) can be satisfied for any inonotonic non-linear relationship between the VGA gain and the control signal, provided that $G_{M2}$ has the same non-linear function within a constant of proportionality.

If the inverse function of the non-linearity can be generated electrically, then $G_{M2}$ can be made to vary linearly with $V_C$ and the gain per stage in a multi-stage VGA will also vary linearly with $V_C$. The AGC operation, except for the circuit used to generate the inverse function, can then be modeled analogously to that shown in FIG. 5.

Figure 6:
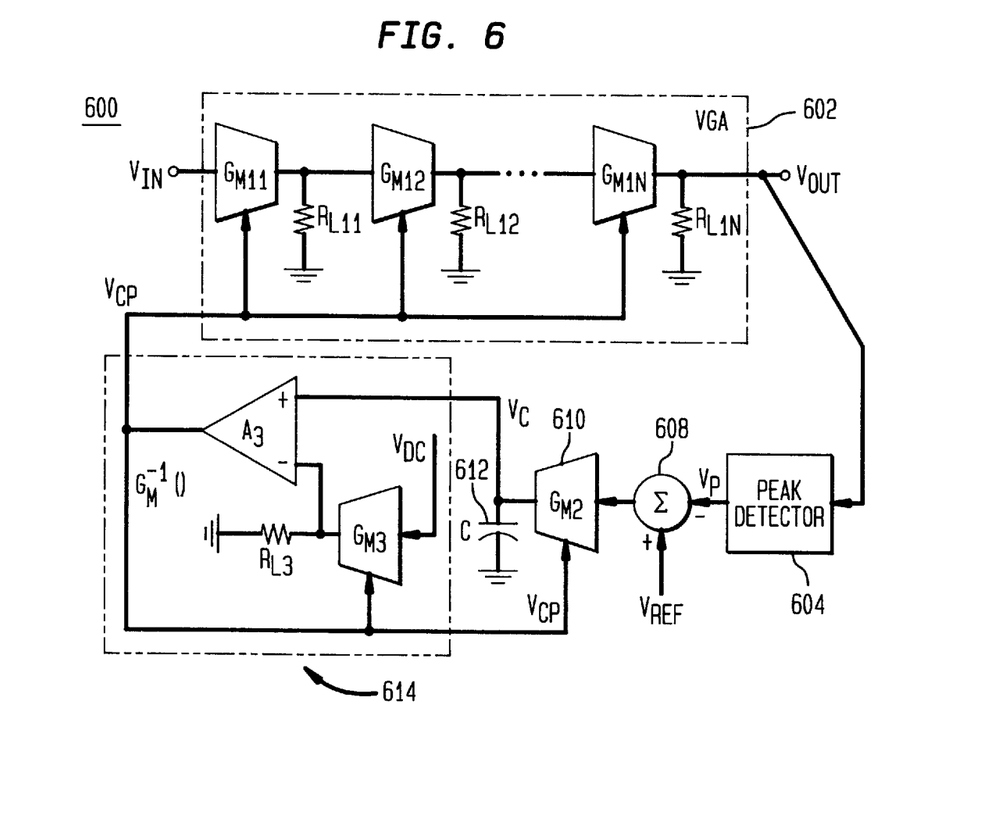
FIG. 6 shows a block diagram of a generalized AGC circuit, according to an alternative embodiment of the present invention.

FIG. 6 shows a block diagram of generalized AGC circuit 600 according to an alternative embodiment of the present invention. AGC 600 comprises multistage VGA 602, peak detector 604, summation node 608, transconductance amplifier 610, capacitor 612, and inverse function 614. AGC circuit 600 achieves constant gain acquisition settling time with arbitrary monotonic non-linearities in the gain control function. For generality, VGA 602 is assumed to be a multistage amplifier. The VGA gain $G(V_{CP})$ and integrator transconductance $G_{M2}(V_{CP})$ are non-linear with respect to $V_{CP}$.

VGA 602 has one or more transconductance amplifiers arranged in cascade and all controlled by the same control signal $V_{CP}$. All of the transconductance amplifiers in VGA 602 have the same non-linear controlling function $G_M(V_{CP})$, except for a constant of proportionality $k_{ij}$. The transconductances in VGA 602 are given by Equation (23) as follows:

$$G_{M1j}(V_{CP}) = k_{1j} G_M(V_{CP}) \text{ for } j=1 \text{ to } N \tag{23}$$

and the remaining two transconductances are given by Equation (24) as follows:

$$G_{Mi}(V_{CP}) = k_i G_M(V_{CP}) \text{ for } i=2,3 \tag{24}$$

Transconductance $G_{M3}(V_{CP})$ replicates the non-linear function in the VGA and integrator amplifiers and is used to generate the inverse function. The negative feedback loop with the ideal op-amp $A_3$, forces $V_C = k_3 G_M(V_{CP}) V_{DC} R_{L3}$. As such, the inverse function is generated Using Equation (25) as follows:

$$V_{CP} = G_M^{-1}\left(\frac{V_C}{k_3 R_{L3} V_{DC}}\right) \tag{25}$$

For the inverse function $G_M^{-1}(\ )$ to exist, $G_M$ must be monotonic.

The VGA gain is the product of the gains of the N stages and is given by equation (26) as follows:

$$G(V_{CP}) = \prod_{j=1}^{N} k_{1j} G_M(V_{CP}) R_{L1j} \tag{26}$$

Using Equation (25), the VGA gain as a function of $V_C$ is given by Equation (27) as follows:

$$G(V_C) = \left[\frac{V_C}{k_3 R_{L3} V_{DC}}\right]^N \prod_{j=1}^{N} k_{1j} R_{L1j} \tag{27}$$

Similarly, the variation of the loop filter's transconductance is given by Equation (28) as follows:

$$G_{M2}(V_c) = \frac{k_2 V_c}{k_3 R_{L3} V_{DC}} \tag{28}$$

Using Equations (17), (27), and (28), the overall time constant for AGC circuit 600 of FIG. 6 can be derived to be as shown in Equation (29) as follows:

$$\tau_{LOOP-NL} = \frac{CR_{L3}}{N} \frac{k_3}{k_2} \frac{V_{DC}}{V_{REF}} \tag{29}$$

The derivation of Equation (29) assumed that a logarithmic amplifier such as log amplifier 306 of FIG. 3 was not used in AGC circuit 600. As such, AGC circuit 600 will behave linearly in dB only for relatively small signals. If a log amplifier is used, then Equation (29) should be modified by substituting $k_{v2}$ of FIG. 3 in place of $V_{REF}$.

With regard to the AGC circuits of FIGS. 5 and 6, the feedback loop can become broken indefinitely if the variable transconductance of the integrator becomes zero. With the appropriate design of $G_{M2}(V_C)$ in FIG. 5, the zero gain state can be prevented. In contrast, tile integrator of FIG. 6 will become disabled if $V_C$ ever becomes zero independent of the non-linearity design, as shown in Equation (28). Therefore, any practical circuit implementation would require an additional non-linearity, such as a clamp, to prevent $V_C$ from reaching zero. As shown in FIG. 6 and Equation (27), in order to maintain non-zero VGA gain, $V_C$ must also be non-zero.

AGC Circuit Simulations

This section presents the results of behavioral level simulations in order to compare the operation of four different AGC amplifier designs, none of which use a logarithmic amplifier such as log amplifier 306 of FIG. 3. The four AGC amplifiers are designed to the following, high-level specifications: (i) gain range from 0 to 40 dB, (ii) nominal output level of 1 $V_{peak}$, (iii) input frequency range from 50 to 100 MHz, (iv) nominal gain acquisition time constant of 0.163 $\mu$sec, (v) peak detector droop rate of 5 Volts/$\mu$sec, and (vi) $V_C$ range from 0 to 3 volts, maximum.

For these simulations, the peak detector is modeled as instantaneously capturing positive peaks. In the absence of a peak, the detector is allowed to droop at a constant rate. This model is analogous to most IC designs that use a capacitor to hold the peaks and a constant current source for droop.

All four designs use an integrating capacitor of C=25 pF in the loop filter and the peak detector hold capacitor is chosen to be 2 pF with a droop current of 10 $\mu$A. The four designs are as follows:

AGC-1: VGA with Exponential Gain Control—This AGC circuit is a classical design of FIG. 1 with the VGA obeying Equation (12) with parameters: $k_{G2}$=1.535; $k_{G1}$=1.0; and $G_{M2}$=100 $\mu$A/V. No clamping is provided on $V_C$.

AGC-2: VGA with Linear Gain Control—This AGC circuit has the same design as FIG. 1, where the gain equation of the VGA is $G(V_C)$=1.0+33.0$V_C$. The overall AGC structure is given in FIG. 1 with no corrective action taken to maintain constant loop dynamics. Since the settling time will vary with gain level, the loop time constant was designed to be 0.163 $\mu$sec at a gain level of 20 dB. The transconductance amplifier in the loop filter has a gain of $G_{M2}$=46.5 $\mu$A/V. No clamping is provided on $V_C$.

AGC-3: VGA with Arbitrary Monotonic Non-Linear Gain Control (1 stage)—This AGC circuit is a single-stage version of the AGC circuit shown in FIG. 6 (i.e., N=1). The non-linear control of the transconductance gain function $G_M(V_{CP})$ is given by Equation (30) as follows:

$$G_M(V_{CP})=b_0+b_1V_{CP}+b_2V_2^{CP}+b_3V_{CP}^3 \quad (30)$$

where $b_0$=3.0×10$^{-3}$; $b_1$=2.0×10$^{-2}$; $b_2$=1.0×10$^{-4}$; and $b_3$=−1.0×10$^{-4}$. The other circuit parameters in Equations (23)–(26) are: $k_{11}$=1.0; $k_2$=1.535×10$^{-1}$; $k_3$=1.0; $R_{L11}$=33.3 k$\Omega$; $R_{L3}$=1.0 k$\Omega$; and $V_{DC}$=1.0 V. To prevent the feedback loop from becoming disabled, $V_C$ is prevented from reaching zero volts and is clamped from 30 mV to 3 V to cover the entire gain range.

AGC-4: VGA with Arbitrary Monotonic Non-Linear Gain Control (3 stages)—This AGC circuit is a three-stage version of the AGC circuit shown in FIG. 6 (i.e., N=3). The circuit parameters for this circuit are the same as for the single-stage AGC-3 circuit, except that $R_{L11}$=$R_{L12}$=$R_{L13}$=1.547 k$\Omega$; $k_2$=5.117×10$^{-2}$; and $V_C$ is clamped to a minimum level of 0.645 V.

Figure 7:
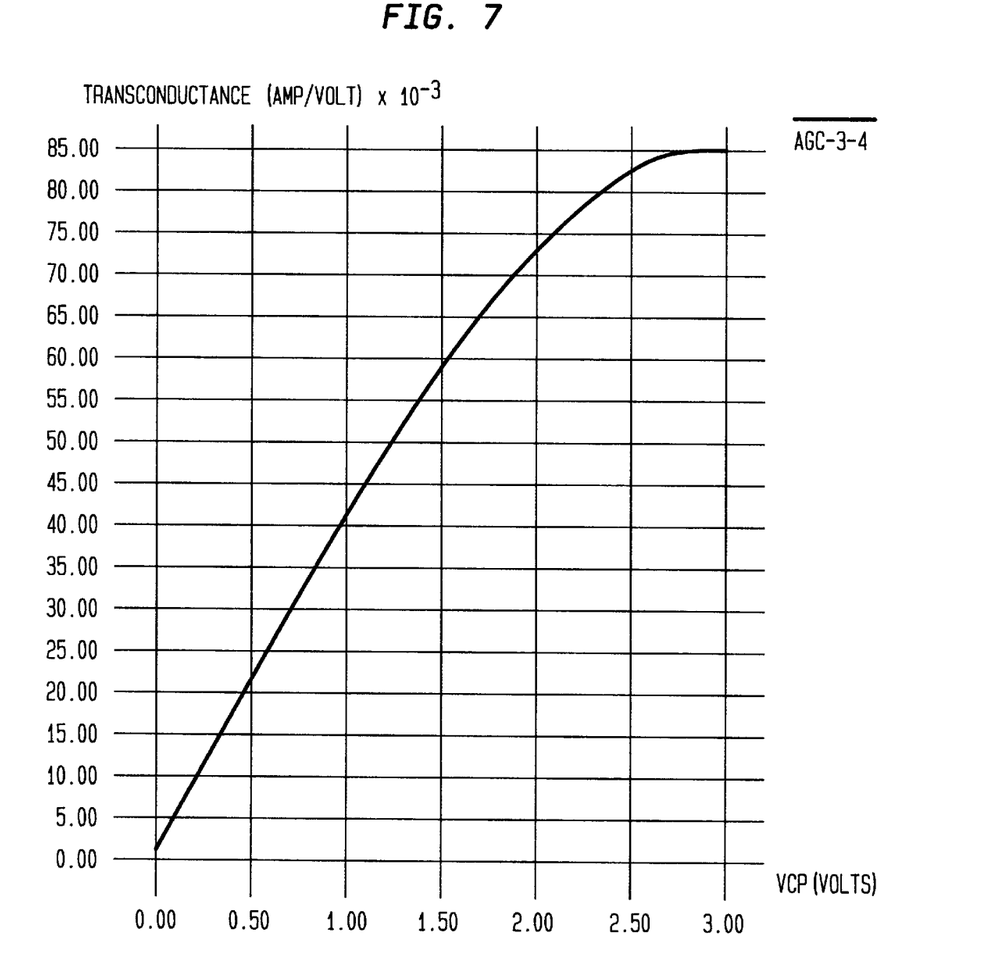
FIG. 7 shows the non-linear transconductor gain for the AGC-3 and AGC-4 circuits plotted versus $V_{CP}$.

FIG. 7 shows the non-linear transductor gain given in Equation (30) for the AGC-3 and AGC-4 circuits plotted versus $V_{CP}$. Without any correction to the non-linearity, the characteristic is seen to be saturating in contrast to an exponentially increasing function.

Figure 8:
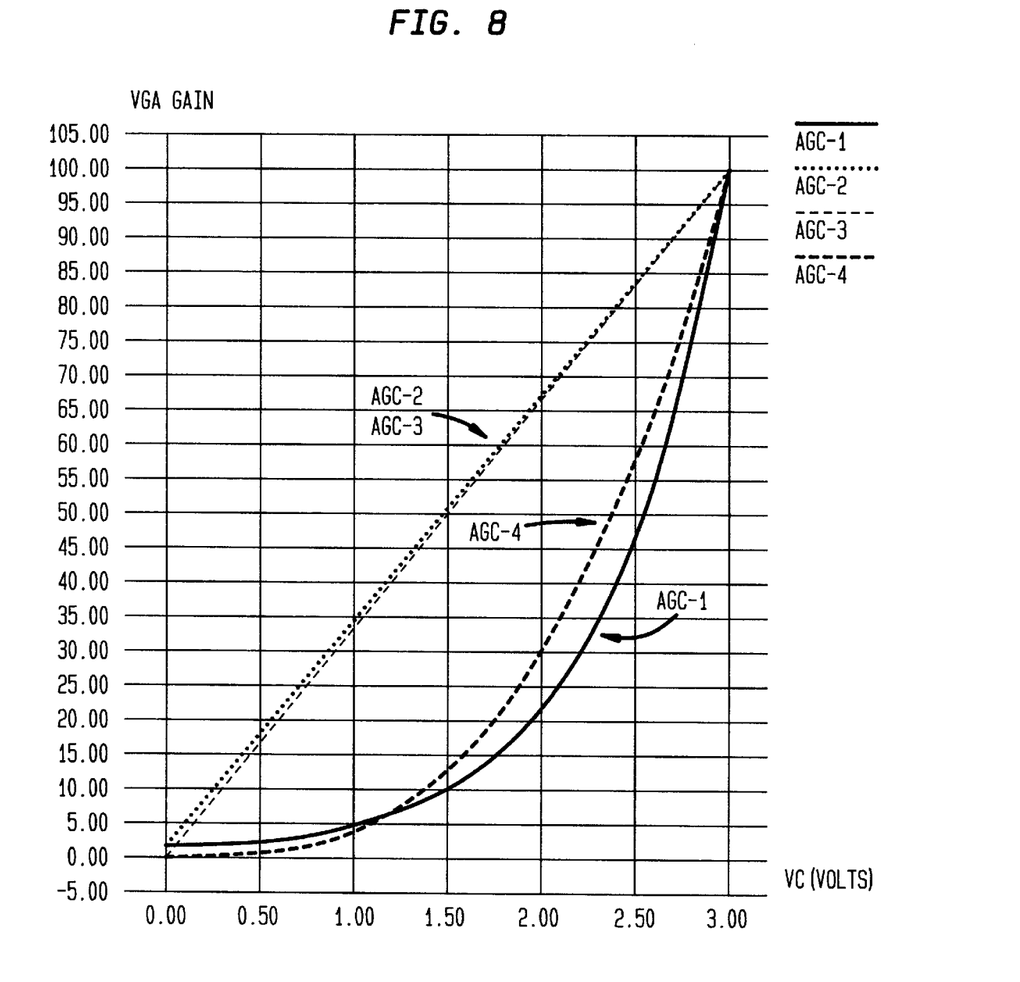
FIG. 8 shows the VGA gain plotted versus $V_C$ for all four simulated circuits.

FIG. 8 shows the VGA gain plotted versus $V_C$ for all four circuits. Note that the non-linearity correction has already been applied to the AGC-3 and AGC-4 circuits in FIG. 8. As a result, the gain of the AGC-3 circuit is linear with $V_C$ and the gain of the AGC-4 circuit increases as $V_C^3$ since a three-stage VGA is employed. See Equation (27). Although the AGC-2 and AGC-3 circuits show a linear gain response to $V_C$, the circuits behave quite differently because the AGC-2 circuit has a fixed loop filter whereas the AGC-3 circuit has a signal-dependent loop filter.

Figure 9:
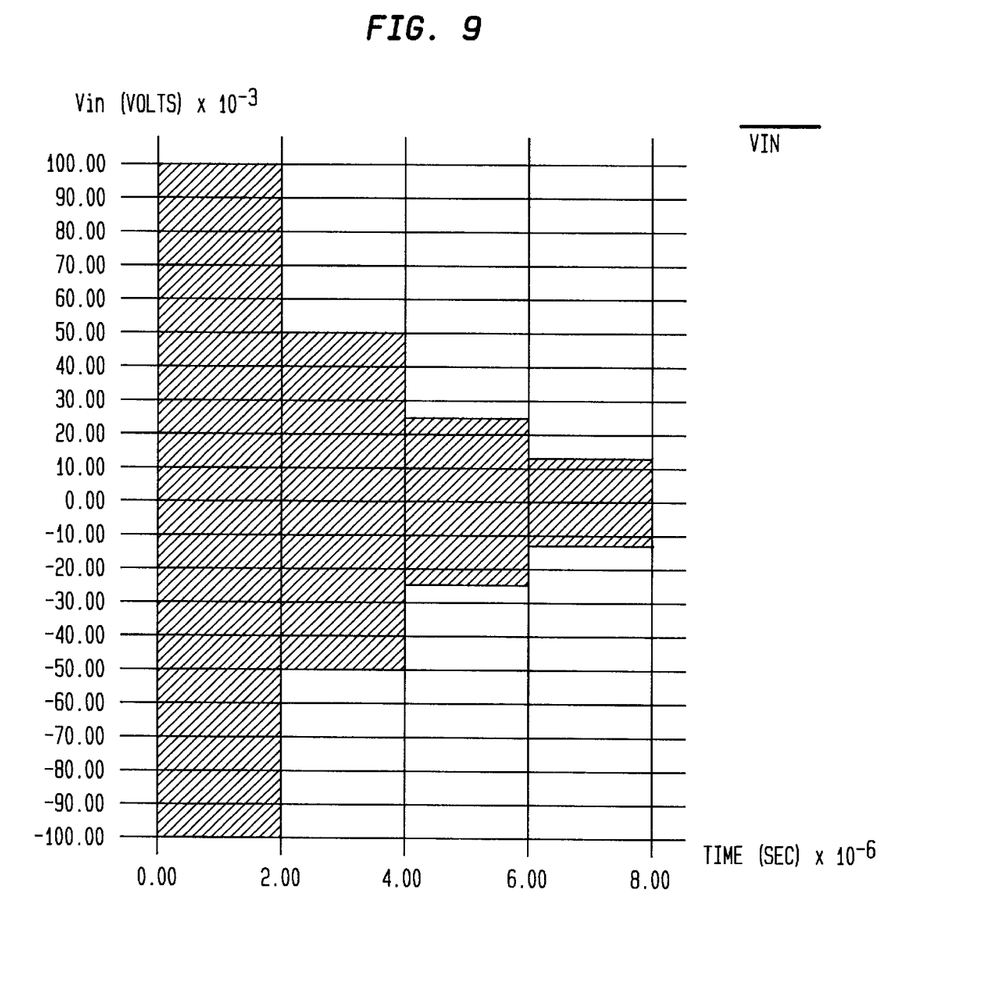
FIG. 9 shows an input waveform to each of the four simulated circuits.

Each of the circuits was driven with a 50 MHz sine wave whose initial input amplitude was 100 m $V_{pk}$, but every 2 $\mu$sec the input signal strength was reduced by 6 dB. FIG. 9 shows the input waveform.

Figure 10:
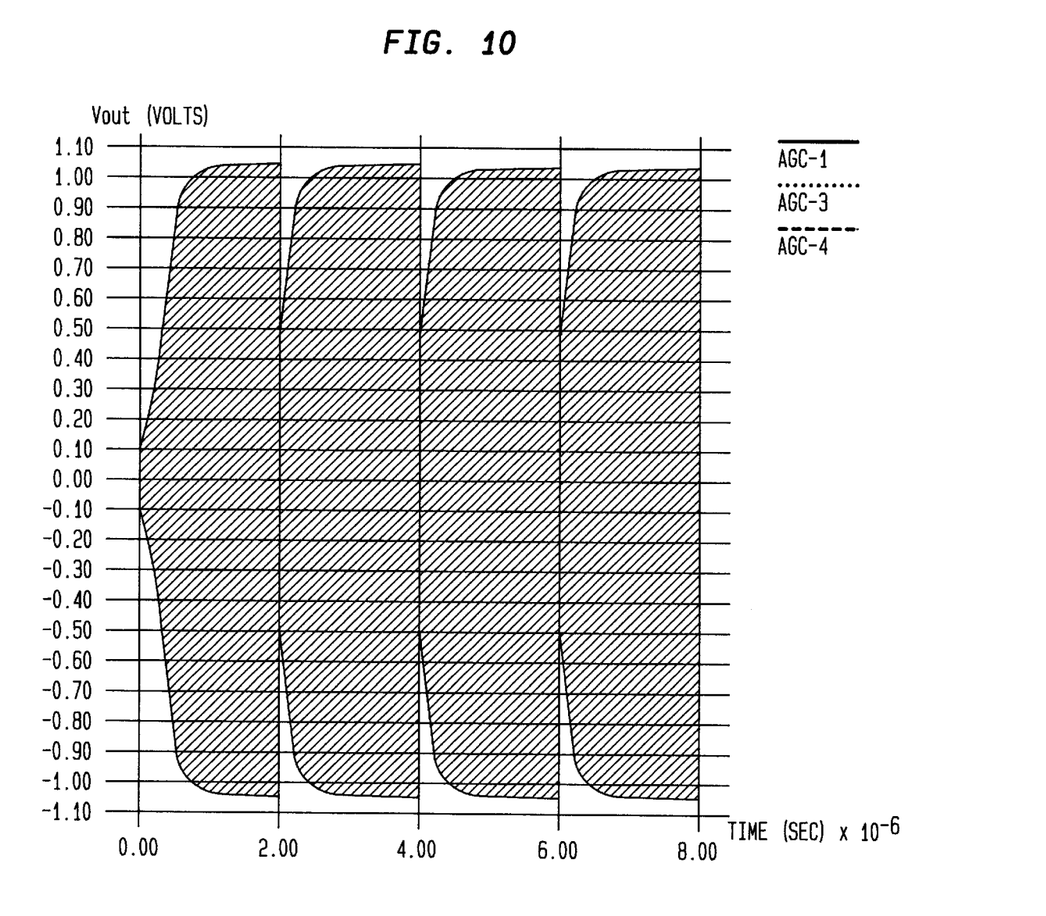
FIG. 10 shows the responses of the AGC-1, AGC-3, and AGC-4 circuits to tile input signal of FIG. 9.
Figure 11:
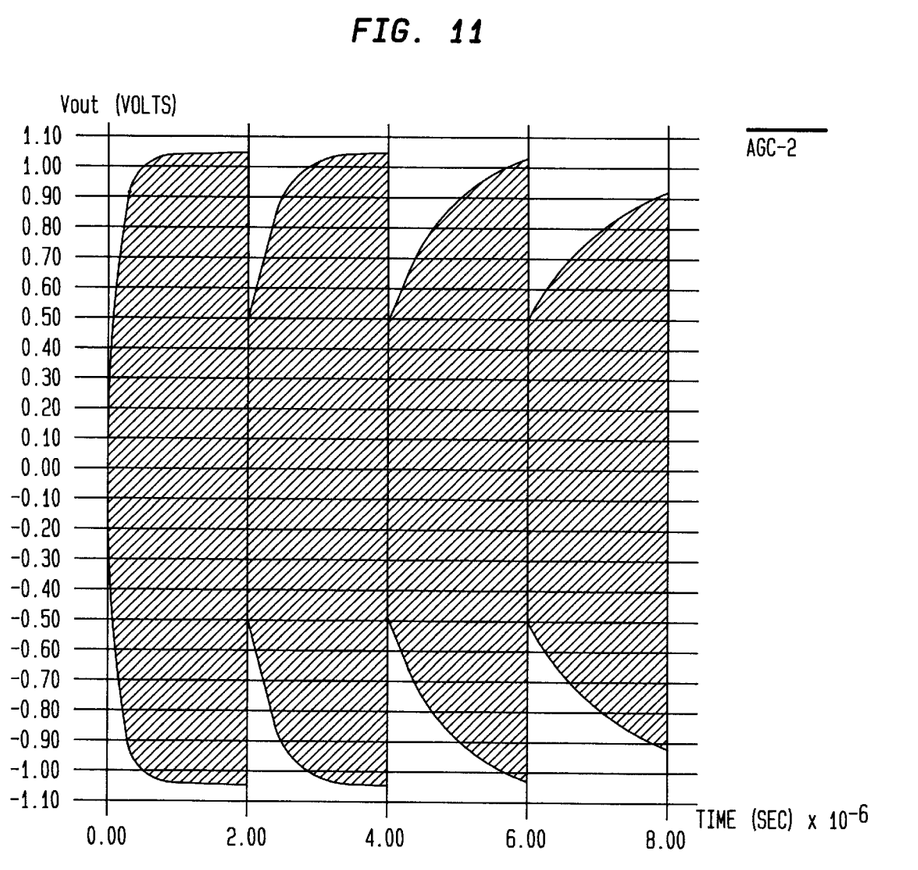
FIG. 11 shows the response of the AGC-2 circuit to the input signal of FIG. 9.

FIG. 10 shows the responses of the AGC-1, AGC-3, and AGC-4 circuits to tile input signal of FIG. 9. Except for small differences between the responses to the initial conditions, the curves are indistinguishable. In contrast, FIG. 11 shows the response of the AGC-2 circuit to the input signal of FIG. 9. In this plot, the gain acquisition response time clearly increases as the input signal amplitude decreases. For further discussion, see D. N. Green, "A Method for Design of Automatic Gain Control Circuits," *IEEE International Symposium on Circuits and Systems*, May 1986, San Jose, pp. 1133–1136, which is incorporated herein by reference.

Figure 12:
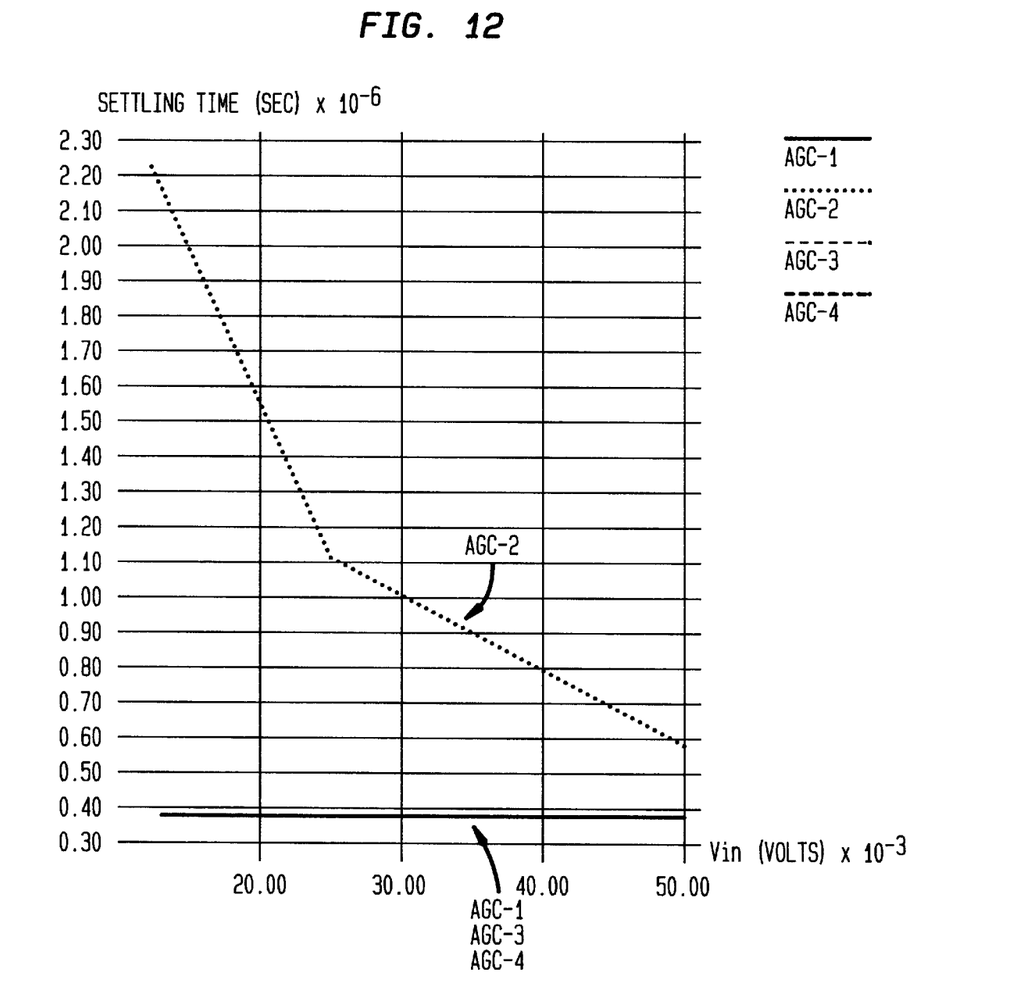
FIG. 12 shows the 5% settling time of the circuit in response to 63-dB input amplitude reductions for all four simulated circuits.

FIG. 12 shows the 5% settling time of the circuit in response to 6-dB input amplitude reductions for all four circuits. As shown in FIG. 12, the AGC-1, AGC-3, and AGC-4 circuits settle to within 5% (i.e., 0.4 dB) of the final value within 0.5 $\mu$sec, as expected (i.e., 3w), whereas the settling of the AGC-2 circuit varies widely.

Figure 13:
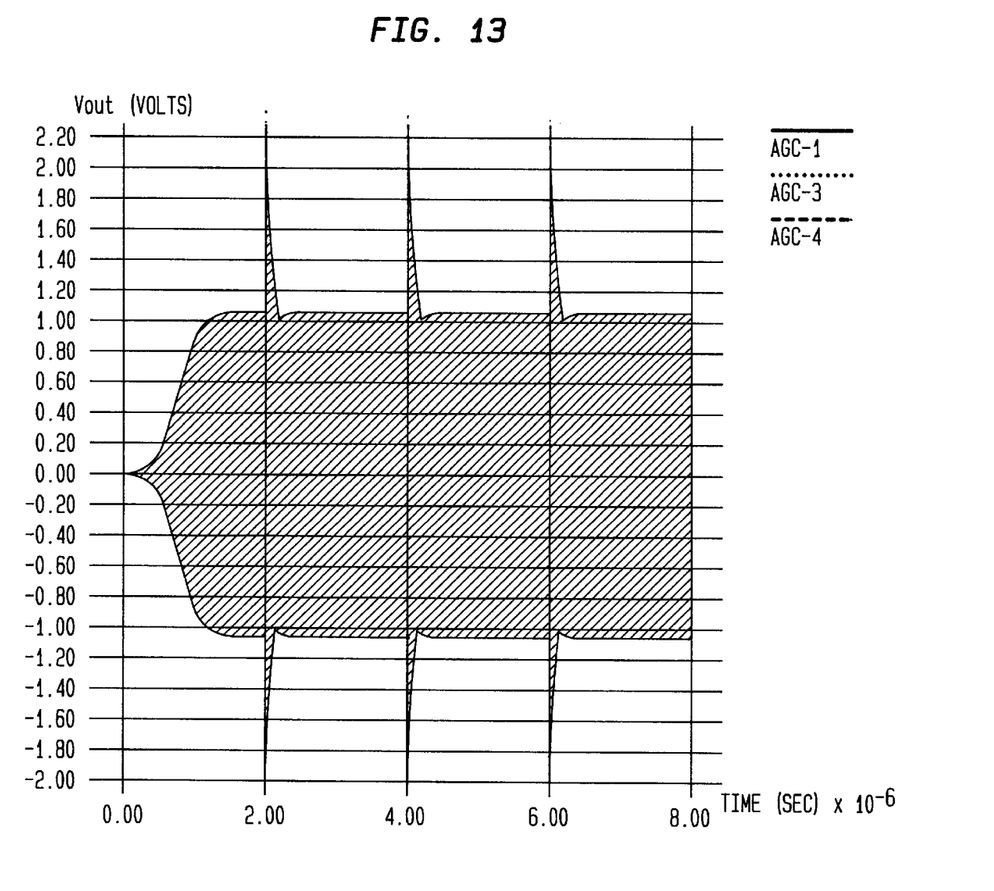
FIG. 13 shows the output signals for the AGC-1, AGC-3, and AGC-4 circuits.
Figure 14:
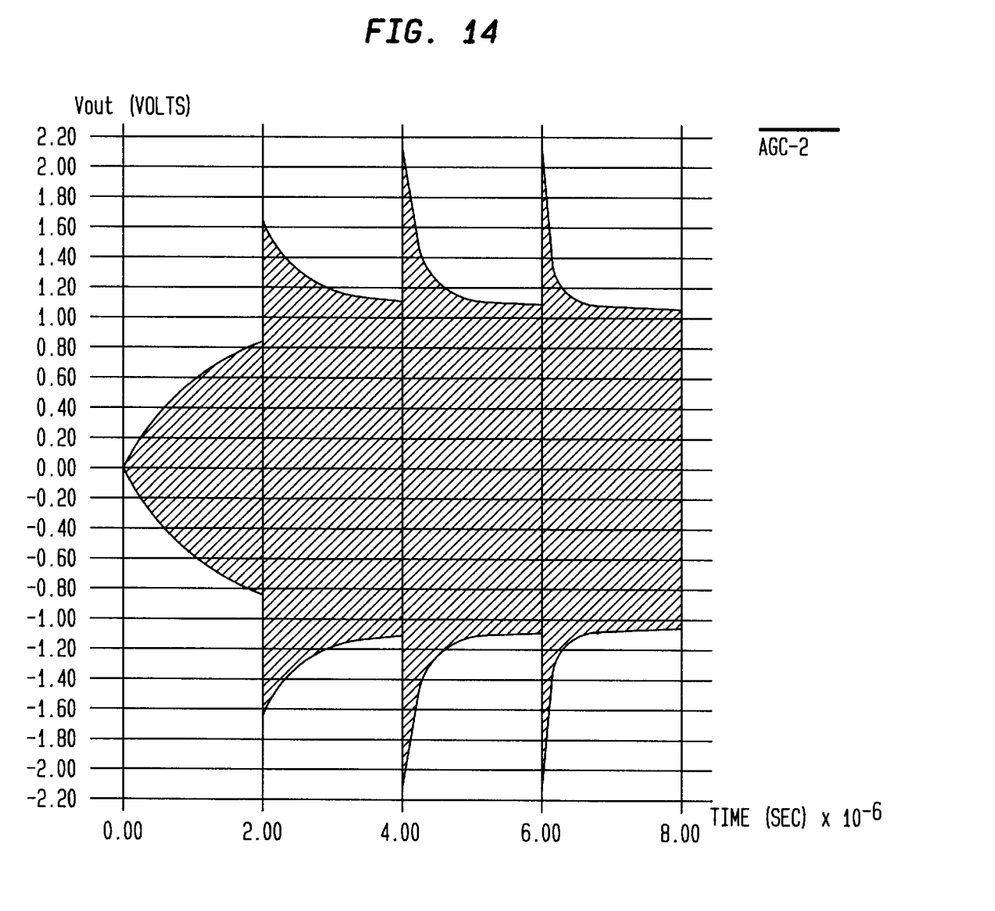
FIG. 14 shows the output signal for the AGC-2 circuit.

The circuits were also simulated with a 50-MHz sine wave whose initial input amplitude was 12.5 m $V_{pk}$, but every 2 $\mu$sec the input signal strength was increased by 6 dB. FIG. 13 shows the output signals for the AGC-1, AGC-3, and AGC-4 circuits, while FIG. 14 shows the output signals for the AGC-2 circuit. As before, the AGC-1, AGC-3, and AGC-4 circuits respond identically, while the response of the AGC-2 circuit is input amplitude dependent. For these simulations, the peak detector droop is not fast enough to track the decreasing output peak amplitude. As such, the gain acquisition time is decreased relative to the previous simulation, because the peak detector output is indicating a larger signal level error than actually exists.

Figure 15:
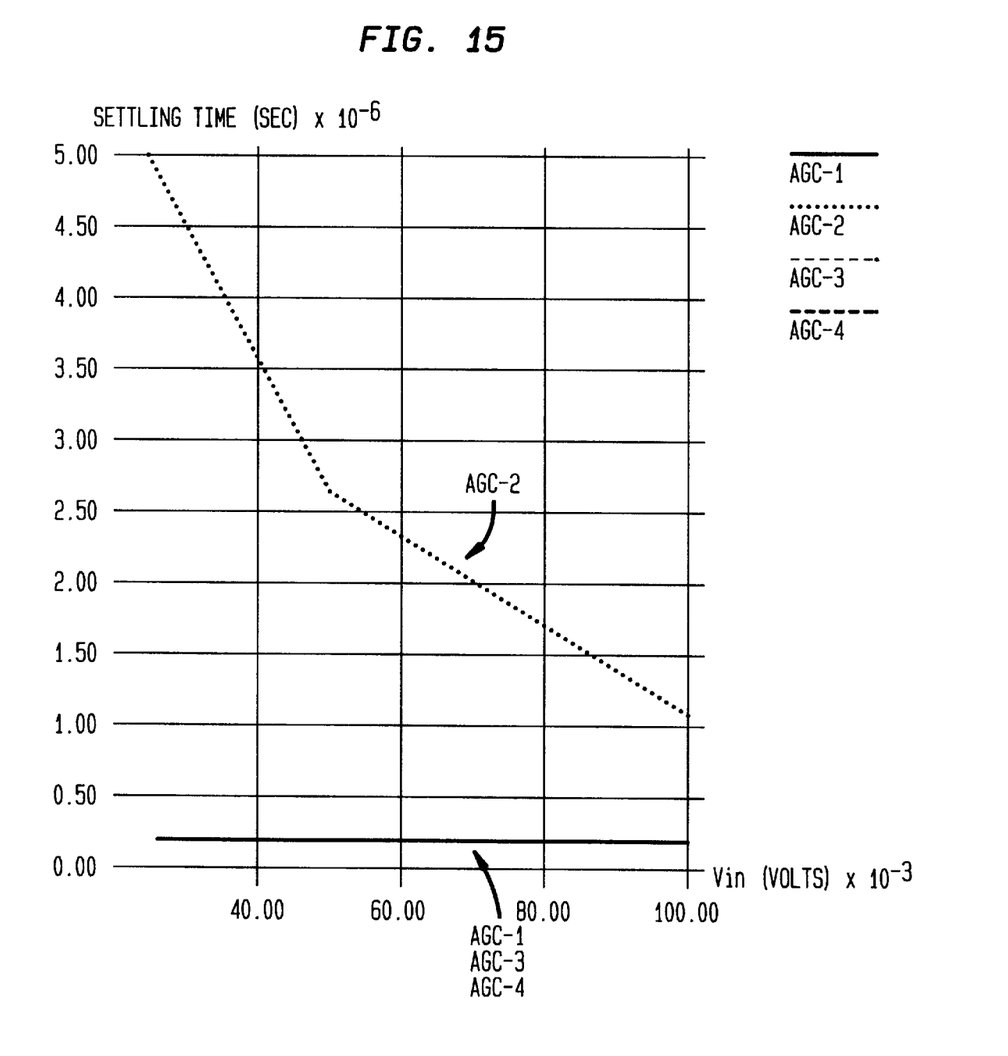
FIG. 15 shows the 5% settling time, for an input signal having a 50-MHz sine wave whose initial input amplitude was 12.5 $mV_{pk}$, but every 2 $\mu$sec the input signal strength was increased by 6 dB.

FIG. 15 shows the 5% settling time of the four AGC circuits. As before, the AGC-1, AGC-3; and AGC-4 circuits settle to within 5% of the final value within 0.5 $\mu$sec, while the settling of the AGC-2 circuit varies widely.

Since the performance of the AGC-3 and AGC-4 circuits matches that of the AGC-1 circuit, these simulation results demonstrate that the technique for achieving constant gain acquisition time of the present invention is viable and gives virtually an identical response as the conventional exponential approach.

According to the present invention, constant gain acquisition times are achieved in AGC circuits without the need for an exponential gain control characteristic. According to one embodiment, matched transconductance amplifiers with arbitrary gain characteristics are used to achieve the same overall results as conventional exponential AGC circuits. Matched transconductance amplifiers that track with temperature and processing changes are readily implemented in mainstream IC technologies such as CMOS as well as bipolar and other technologies, including digital implementations in software and firmware. Constant gain settling design permits the speed of the AGC acquisition to be maximized while maintaining stability. Additionally, having well-defined loop dynamics eases the implementation of stable AGC circuits that use higher-order loop filters.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. An automatic gain control (AGC) circuit having a substantially constant settling time, comprising:
    a variable gain amplifier (VGA) wherein gain of the VGA is non-exponentially controlled by a control signal; and
    a feedback loop providing the control signal to control the gain of the VGA, the feedback loop having a signal magnitude detector coupled to detect the magnitude of an output of the VGA, a summation node configured to generate a difference signal based on an output of the signal magnitude detector and a reference signal, and a non-linear loop filter configured to generate the control signal based on the difference signal.

2. The invention of claim 1, wherein the control signal controls gain of the loop filter.

3. The invention of claim 1, wherein the the signal magnitude detector is a peak detector and the summation node is connected to generate an input to the loop filter corresponding to a difference between an output of the peak detector and a reference voltage.

4. The invention of claim 3, wherein the feedback loop further comprises a logarithmic amplifier connected to amplify the output of the peak detector for input to the summation node.

5. The invention of claim 1, where the VGA comprises at least one amplifier and the loop filter comprises an amplifier, wherein the VGA amplifier and the loop filter amplifier comprise matched transconductance amplifiers.

6. The invention of claim 1, wherein the VGA and the loop filter comprise MOS devices.

7. The invention of claim 1, wherein the VGA comprises a plurality of transconductance amplifiers connected in cascade, wherein gain of each VGA transconductance amplifier is controlled by the control signal.

8. The invention of claim 1, wherein the loop filter comprises a first transconductance amplifier whose gain is controlled by the control signal.

9. The invention of claim 8, wherein an output of the first transconductance amplifier is the control signal.

10. The invention of claim 8, wherein the loop filter further comprises a capacitor, one side of which is connected to a reference voltage and another side of which is connected to the control signal.

11. The invention of claim 8, wherein the loop filter further comprises a capacitor, a second transconductance amplifier, and an operational amplifier, wherein:
    gain of the second transconductance amplifier is controlled by the control signal;
    an input to the second transconductance amplifier is a first reference voltage;
    an output of the second transconductance amplifier is a first input to the operational amplifier;
    one side of the capacitor is connected to a second reference voltage;
    another side of the capacitor is connected to an output of the first transconductance amplifier, which is connected to a second input to the operational amplifier; and
    an output of the operational amplifier is the control signal.

12. The invention of claim 11, wherein:
    the VGA and the loop filter comprise MOS devices;
    the signal magnitude detector is a peak detector and the summation node is connected to generate an input to the loop filter corresponding to a difference between an output of the peak detector and a third reference voltage;
    the VGA comprises one or more amplifiers connected in cascade, wherein the VGA amplifiers and the loop filter amplifiers comprise matched transconductance amplifiers; and
    gain of each VGA transconductance amplifier is controlled by the control signal.

* * * * *